United States Patent

Wilczak et al.

[11] Patent Number: 5,294,515
[45] Date of Patent: Mar. 15, 1994

[54] PHOTOPOLYMERIZABLE, NEGATIVE WORKING, PEEL DEVELOPABLE, SINGLE SHEET COLOR PROOFING SYSTEM

[75] Inventors: Wojciech A. Wilczak, Jersey City; Timothy Hannigan, Basking Ridge, both of N.J.

[73] Assignee: Hoechst Celanese Corporation, Somerville, N.J.

[21] Appl. No.: 703,424

[22] Filed: May 17, 1991

[51] Int. Cl.$^5$ ............ G03F 7/34; G03C 3/00
[52] U.S. Cl. ............ 430/253; 430/254; 430/257; 430/292; 430/293; 430/328; 430/330; 430/358
[58] Field of Search ............ 430/253, 254, 257, 258, 430/259, 260, 263, 292, 291, 293, 273, 358, 288, 271, 330, 328

[56] References Cited

U.S. PATENT DOCUMENTS

| | | |
|---|---|---|
| 3,798,034 | 3/1974 | Laridon ............ 430/358 |
| 4,174,216 | 11/1979 | Cohen et al. ............ 430/257 |
| 4,210,711 | 7/1988 | Kitajima et al. ............ 430/253 |
| 4,247,619 | 1/1981 | Cohen et al. ............ 430/253 |
| 4,282,308 | 8/1981 | Cohen et al. ............ 430/271 |
| 4,284,703 | 8/1981 | Inoue et al. ............ 430/142 |
| 4,304,836 | 12/1981 | Cheema et al. ............ 430/252 |
| 4,304,838 | 12/1981 | Hasegawa et al. ............ 430/253 |
| 4,304,839 | 12/1981 | Cohen et al. ............ 430/253 |
| 4,316,951 | 2/1982 | Cohen et al. ............ 430/253 |
| 4,356,251 | 10/1982 | Cohen et al. ............ 430/253 |
| 4,357,413 | 11/1982 | Cohen et al. ............ 430/253 |
| 4,458,003 | 7/1984 | Shepherd et al. ............ 430/253 |
| 4,489,153 | 12/1984 | Ashcraft et al. ............ 430/253 |
| 4,489,154 | 12/1984 | Taylor, Jr. ............ 430/253 |
| 4,504,571 | 3/1985 | Yamamura et al. ............ 430/253 |
| 4,596,757 | 6/1986 | Barton et al. ............ 430/257 |
| 4,650,738 | 3/1987 | Platzer et al. ............ 430/143 |
| 4,659,642 | 4/1987 | Platzer et al. ............ 430/143 |
| 4,895,787 | 1/1990 | Platzer ............ 430/253 |
| 4,937,168 | 6/1990 | Platzer ............ 430/143 |
| 4,987,051 | 1/1991 | Taylor, Jr. ............ 430/253 |

FOREIGN PATENT DOCUMENTS 0385466 3/1990 European Pat. Off. .

OTHER PUBLICATIONS

Edwin P. Plueddemann; "Silane Coupling Agents", Plenum Press, New York, 1982, pp. 4–5.
Encyclopedia of Polymer Science and Engineering, vol. 1 1985, "Adhesion & Bonding", pp. 480, 481, 490–493.
Encyclopedia of Polymer Science and Engineering, 2nd. Ed. vol. 12; "Polyester Films"; pp. 55, 56, 61, 209, 210, 216.

Primary Examiner—Marion E. McCamish
Assistant Examiner—Janis L. Dote
Attorney, Agent, or Firm—Palaiyur S. Kalyanaraman

[57] ABSTRACT

This invention relates to negative working photopolymerizable sheet constructions which, upon exposure to an actinic radiation source through a screened image, can accurately reproduce said image. The construction is useful as a color proofing film which can be employed to accurately predict the image quality from a lithographic printing process. Image development is by peel apart processing.

31 Claims, No Drawings

PHOTOPOLYMERIZABLE, NEGATIVE WORKING, PEEL DEVELOPABLE, SINGLE SHEET COLOR PROOFING SYSTEM

BACKGROUND OF THE INVENTION

In the art of lithographic printing, it is desirable to produce a multi-color proofing image to assist the printer in correcting a set of color separation films prior to using them to produce expensive metal based lithographic printing plates. The proof should reproduce the image and color quality that will ultimately be obtained during the printing process. The proof must be a consistent duplicate of the desired halftone image. Visual examination of a color proof should show the color rendition to be expected from press printing using the color separations as well as any defects on the separations which might need to be altered before making the printing plates.

There are two general types of color proofing films, namely the overlay type and the single sheet type. In the overlay type of color proofing, separate transparent supports are used for bearing each color separation partial image. Several of these supports carrying images of the corresponding colors are then superimposed upon each other over a white background sheet to produce a color proofing composite. A key advantage of overlay proofs is that they can be made quickly and can serve as a progressive proof by combining any two or three colors in register. However, overlay proofing has the disadvantage that the superimposed plastic supports tend to darken the color proofing sheet and the impression of the color proofing composite thus prepared is different from that of copies actually obtained with conventional printing presses and with proof presses. Examples of overlay approaches are in U.S. Pat. Nos. 3,136,637; 3,211,553; and 3,326,682.

In the single sheet type of color proofing, a colored image is prepared by successively producing images of different colors on a single receiver sheet. This is done by sequentially applying colored photosensitive layers to a single opaque support. This method more closely resembles the actual printing process and eliminates the color distortion inherent in the overlay system. Examples of such single sheet approaches are found in U.S. Pat. Nos. 3,671,236; 4,260,673; 4,366,223; 4,650,738; 4,656,114; and 4,659,642. Various methods of producing the images on the proofing films are known. These include photosensitive layers whose images are formed either by using a wet developer or by peel apart development. The present invention relates to an improved single sheet type color proofing film of the peel apart type.

U.S. Pat. No. 3,574,049 provides a thermal transfer process for printing a design on a final support by printing a design onto a temporary support, superimposing the temporary support and a final support, applying heat and/or pressure to the superimposed structure and separating the temporary support from the final support which retains the printed design. The affinity of the matter of the design towards the final support is greater than its affinity towards the temporary support This process has the disadvantage of requiring a printing step. Other processes for producing single sheet color proofs of an image embodying thermal transfer and photopolymerization techniques are shown in U.S. Pat. Nos. 3,060,023; 3,060,024; 3,060,025; 3,481,736; and 3,607,264. In these processes, a photopolymerizable layer coated on a support is imagewise exposed through a color separation film. The surface of the exposed layer is then pressed into contact with an image receptive surface of a separate element. At least one of the elements is heated to a temperature above the transfer temperature of the unexposed portions of the layer. The elements are then separated, and the thermally transferrable, unexposed, image areas of the composite transfer to the image receptive element. If the element is not precolored, the tacky unexposed image may now be selectively colored with a desired toner. The colored matter preferentially adheres to the clear unpolymerized material.

U.S. Pat. No. 3,721,557, a method for transferring colored images is shown which provides a stripping layer coated between a photosensitive element and a support. When the photosensitive layer is exposed to actinic light and developed, the more soluble portions are selectively removed to produce a visible image. The image carrying support is pressed against a suitable adhesive coated receptor member and the carrier support is subsequently stripped to accomplish the transfer of the image A fresh layer of adhesive must be applied to the receptor for each subsequent transfer. U.S. Pat. No. 4,596,757 provides a method for transferring images or solid colors which are subsequently imaged. The photosensitive material comprises a carrier support having sequentially disposed thereon a release layer; a colored, photopolymerizable layer; and an adhesive layer. The material can undergo exposure, lamination to a temporary support, wet development, and then lamination to a receptor sheet. Alternatively, the photosensitive material can be laminated to a receptor sheet, undergo exposure, and then wet processed. Both processes require development in an aqueou medium.

In U.S. Pat. No. 4,489,154, a process is claimed which produces a single layer color proof without wet development. The photosensitive material comprises a strippable cover sheet; a colored photoadherent layer; a nonphotosensitive organic contiguous layer; and a sheet support. The material is exposed and peel developed. The positive or negative image is transferred to a receiver base. A fresh layer of adhesive is applied to the receptor for each subsequent transfer.

U.S. Pat. No. 4,895,787 demonstrates a positive-acting peel apart color proofing method which uses a photosensitive element having a transparent support, adhesion promoted surface and a photosensitive composition layer on the adhesion promoted surface. The photosensitive layer comprises a binding resin, colorant, and a photopolymerizable composition. An adhesive layer is adhered to the photosensitive layer. In image formation, a receiver base is laminated to the adhesive layer and then the photosensitive composition is exposed through the transparent support. After peeling apart the support and receiver base, the adhesive layer and the image-wise nonexposed portions of the photosensitive composition are transferred to the receiver base while the imagewise exposed portions remain on the adhesion promoted surface of the support.

SUMMARY OF THE INVENTION

The invention provides a method for forming a colored image which comprises, in order:

(A) providing a photosensitive element which comprises, in order:

(i) a transparent support having a release surface; and (ii) a photosensitive composition layer on said release surface, which photosensitive layer comprises an organic binding resin, a colorant, a photoinitiator, and a free radical polymerizable acrylate or methacrylate component having at least two ethylenically unsaturated groups, wherein said binding resin is present in sufficient amount to bind the composition components into a uniform film, and wherein said colorant is present in sufficient amount to uniformly color the composition, and wherein said photoinitiator is present in sufficient amount to initiate the free radical polymerization of said polymerizable component upon exposure to sufficient actinic radiation, and wherein said polymerizable component is present in sufficient amount to provide image differentiation when the composition is imagewise exposed to actinic radiation; and (iii) an thermoplastic adhesive layer adhered to said colored, photosensitive layer, which adhesive layer comprises a thermoplastic resin which has a $T_g$ in the range of from about 25° C. to about 100° C.; and (B) providing a receiver base to which said adhesive layer is laminated at elevated temperature and pressure; and then imagewise exposing said photosensitive composition through the transparent support to actinic radiation; and (C) stripping away said transparent support and said release surface from said photosensitive composition layer thereby transferring the adhesive layer and the entire colored, photosensitive composition layer to the receiver base; and (D) providing a transparent cover sheet having an adhesion promoted surface, and laminating said transparent cover sheet with heat and pressure, to said photosensitive composition layer with the adhesion promoted surface between the transparent cover sheet and said photosensitive composition layer; and (E) overall exposing said photosensitive composition through the transparent cover sheet to actinic radiation; and (F) peeling apart said transparent cover sheet with its adhesion promoted surface and said receiver base, thereby transferring the imagewise exposed portions of the colored, photosensitive composition from step (B) to the receiver base while the imagewise nonexposed portions of the colored, photosensitive composition from step (B) are transferred to the adhesion promoted surface of the transparent cover sheet.

In the preferred embodiment, steps (A) through (F) are repeated at least once wherein another photosensitive element according to step (A) having at least one different colorant is transferred to the adhesive layer and image portions of the previously processed photosensitive element on said receiver base.

DETAILED DESCRIPTION OF THE PREFERRED EMBODIMENT

In the usual full color proofing, four distinct colored images are formed, namely magenta, cyan, yellow, and black. When the images are superimposed upon each other, a simulated full color reproduction results. As hereinbefore described, one begins the process of the present invention by preparing a photosensitive element which has a transparent support having a release surface. Sequentially carried on the release surface are a colored, photopolymerizable layer and a thermoplastic adhesive layer.

In the preferred embodiment, the support may be composed of any suitable flexible sheet material provided it is transparent to the actinic radiation for the photopolymerizable layer. It should be dimensionally stable when undergoing the herein specified lamination processes. That is, it should have substantially no change in dimensions under heating in the range of approximately 60° C. to 120° C. during lamination. One preferred material is polyethylene terephthalate. In the usual case, it has a thickness of approximately 20 to 200 um and a more preferred thickness of approximately 50 to 80 um. Suitable films nonexclusively include Melinex 054, 504, 505 and 582 available from ICI, and Hostaphan 4400, 4500, and 4540 available from Hoechst Celanese Corporation.

The support must have a slip or release surface which is capable of being stripped away from the photosensitive composition layer after it is laminated to the receiver base and imagewise exposed. In the preferred embodiment, the release surface is provided by treating the transparent support with a silicone release material. In another preferred embodiment, the release material is Vinex 4004, a polyvinylalcohol containing copolymer from Air Products of Allentown, Penn. In one particularly preferred embodiment, a transparent support is used which comprise polyethylene terephthalate having a silicone coating, namely, a polydimethylsiloxane release surface which is available commercially from Custom Coating and Lamination Corporation in Worcester, Mass. Certain untreated polyethylene sheets may have sufficient release so that no further treatment is required. In yet another preferred embodiment, the release surface is provided on a transparent support which has an underlying adhesion promoted surface, such as Melinex 505 from ICI.

The photosensitive composition layer comprises a photopolymerizable component, photoinitiator, colorant, binder, and optional other ingredients.

The photopolymerizable monomer or oligomer contained in the colored, photosensitive layer preferably comprises an addition polymerizable, nongaseous (boiling temperature above 100° C. at normal atmospheric pressure), ethylenically unsaturated compounds containing at least two terminal ethylenically unsaturated groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, and trimethylolpropane propoxylate triacrylate.

Free radical liberating photoinitiators include any compound which liberate free radicals on stimulation by actinic radiation. Preferred photoinitiators nonexclusively include quinoxaline compounds as described in U.S. Pat. No. 3,765,89as well as 2,3-di (4-methoxyphenyl)quinoxaline; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185as well as bis(2,4,5-triphenyl)imidazole; the alpha-hydrocarbon substituted aromatic acyloins in U.S. Pat. No. 2,722,512; polynuclear quinones in U.S. Pat. Nos. 2,951,758 and 3,046,127; and s-triazines in U.S. Pat. No. 4,656,272; and 9-phenylacridine; combinations thereof. The most preferred photoinitiator is 2-biphenyl-4,6-bis-trichloromethyl-s-triazine.

Colorants can be dyes and/or pigments and are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 um.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these pigments are available from Hoechst AG. They can be used separately or blended for a desired color. Dyes may be included to spectrally sensitize the photoinitiator, such as described in U.S. Pat. Nos. 4,282,309 and 4,454,218, and European Patent Applications 0,179,448 and 0,211,615.

The photosensitive layer also contains a binder which not only determines the hardness and/or flexibility of the coating but is also used to control the dry development. For example, the colored layer will remain with its support in the exposed and nonexposed areas if the binder readily adheres to the adhesion promoted surface and if too much of this type of binder is used. If the binder readily releases from the surface and if too much of this type of binder is used, then the colored layer will be totally transferred to the adhesive layer.

Binders found suitable for the photosensitive layer are styrene/maleic anhydride copolymers and their half esters; acrylic polymers and copolymers; polyamides; polyvinyl pyrrolidones; cellulose and its derivatives; phenolic resins; and the like. The most preferred binders are polyvinyl acetals, such as polyvinyl butyral vinyl formal polymers or copolymers containing vinyl formal and polyvinyl propional. The most preferred binders are polyvinyl formals which are commercially available from Monsanto as Formvar. The formal content of the polyvinyl formals is approximately 65% to 86% expressed as percent polyvinyl formal. The acetate content is approximately 9% to 30% expressed as percent polyvinyl acetate. The hydroxyl content is approximately 5% to 7% as expressed as percent polyvinyl alcohol. The average molecular weight is between 10,000 and 40,000.

The colored, photosensitive layer is applied from a solvent coating composition to the release layer of the transparent support. Organic solvents are preferred for the photosensitive coating because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, and gamma-butyrolactone.

Other ingredients which may be present in the photosensitive layer are thermal polymerization inhibitors spectral sensitizers, plasticizers, oligomers, residual solvents, surfactants, inert fillers, antihalation agents, hydrogen atom donors, photoactivators, and optical brightening agents, the compositions of which are well known to the skilled artisan.

In the preferred embodiment, the dried photosensitive layer has a coating weight range between approximately 0.1 and 5 $g/m^2$. The more preferred coating weight is between approximately 0.4 to 2 $g/m^2$.

In the practice of the present invention, the photopolymerizable monomer component is preferably present in the photosensitive composition layer in an amount ranging from approximately 10% to 60% based on the weight of the solids in the layer. A more preferred range is from approximately 15% to 40%.

The photoinitiator component is preferably present in the photosensitive composition layer in an amount ranging from approximately 2% to 30% based on the weight of the solids in the layer. A more preferred range is from approximately 6% to 20%.

The colorant component is preferably present in the photosensitive composition layer in an amount ranging from approximately 10% to 50% based on the weight of the solids in the layer. A more preferred range is from approximately 15% to 35%.

The binder component is preferably present in the photosensitive composition layer in an amount ranging from approximately 10% to 75% based on the weight of the solids in the layer. A more preferred range is from approximately 20% to 50%.

The thermoplastic adhesive layer is next applied to the photosensitive layer. Its purpose is to aid in the transfer of the coated composite to the receiver base and to protect the integrity of underlying, previous formed images during dry development of subsequent layer(s). The application of the adhesive may be accomplished in several different ways. For example, some adhesives may be coated on top of the photosensitive layer out of organic solvents which do not have any solubilizing or deleterious effect on the photosensitive layer. Such solvents can include cyclohexane, n-heptane, and n-hexane. Other adhesives may be coated out of water mixtures. Acrylic copolymers with high acid numbers, such as Carboset 525 from B. F. Goodrich, can be coated out of ammonium hydroxide:water mixtures. Alternatively, some adhesives may be coated as aqueous emulsions. Examples of aqueous emulsions include polyvinylocetate/crotonic acid ammonia salt (Mowilith CT-5) from Hoechst AG, vinyl acetate copolymers such as Mowilith DM-6 and DM-22 from Hoechst AG, and Vinac XX-210 and 465 DEV from Air Products. Some adhesives may be applied by hot melt extrusion. Suitable adhesives for this method of application include the ethylene/vinyl acetate copolymers, such as Elvax 40-W and 150-W from DuPont.

The adhesive layer is distinguishable from an adhesion promoted surface. The adhesive layer is defined for the purpose of this invention as a layer consisting of an adhesive which flows and wets both surfaces of the elements to which it adheres and fills in the gaps of their surfaces under suitable conditions. Adhesive layers are generally thicker than 1 um.

The preferred method for applying the adhesive to the photosensitive composition layer is by laminating the two together under elevated pressure and/or temperature. The adhesive is initially coated onto a temporary support. The dried adhesive may then be transferred directly to the photosensitive layer. The temporary support is removed, and then the adhesive with the photosensitive layer and support is laminated to a receiver base. Alternatively, the dried adhesive may be laminated to the receiver base. The temporary support is removed, and the photosensitive layer with support is laminated to the adhesive on the receiver base.

Acrylic polymers and copolymers are preferred for the lamination method for applying the adhesive to the photosensitive layer. Vinyl acetate polymers and copolymers are more preferred for this lamination method. Polyvinyl acetates are available from Hoechst AG as Mowilith. These resins have a average molecular weight between 35,000 and 2,000,000. They have a softening temperature between 80° C. and 180° C. In the preferred embodiment, the polyvinyl acetate is present in the adhesive layer in an amount of greater than approximately 50 percent by weight. The adhesive resin should have a $T_g$ in the range of from about 25° C. to about 100° C. and softening temperature in the range of approximately 40° C. to 200° C., more preferably 60° C. to 120° C. one or more such polymers may be present in the adhesive layer. The layer may optionally contain such other desired components as UV absorbers, antistatic compositions, optical brighteners, and plasticizers. Suitable plasticizers include phthalates, nonexclusively including dibutyl phthalate, butyl benzyl phthalate, and dimethyl phthalate. Polymeric plasticizers, such as Resoflex R-296 available from Cambridge Industries, may also be used. The plasticizer may be present in the adhesive layer in an amount of up to approximately 30 percent by weight.

In the preferred embodiment, the dry adhesive layer has a coating weight range between approximately 2 and 30 g/m². The more preferred coating weight is between approximately 4 and 15 g/m². The thickness of the adhesive may be adjusted to regulate the apparent dot size of the final proof.

Receiver bases may comprise virtually any material which can withstand the laminating and dry development processes. Non-transparent, preferably white plastic sheets, such as adhesion promoted, filled polyethylene terephthalate Melinex 3020 from ICI, are useful for this purpose. Plastic coated paper sheets, such as polyethylene coated paper from Schoeller, may also be used. Other bases may include wood, paper, glass, metal, and the like.

Lamination may be conducted by putting the two materials in contact and then introducing the materials into the nip of a pair of heated laminating rollers under suitable pressure. Suitable laminating temperatures usually range from approximately 60° C. to 120° C., preferably from 70° C. to 100° C.

The photosensitive layer is then exposed through the transparent support by means well known in the art either before or after the adhesive layer is applied to the photosensitive layer. Such exposure may be conducted by exposure to actinic radiation from a uv light source through a conventional halftone positive color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

After lamination of the adhesive layer with the photosensitive layer and its support to the receiver base and after exposure of the photosensitive layer, the transparent support with its release layer is stripped away from the photosensitive composition layer. The entire adhesive layer and the entire photosensitive composition layer, i.e. both the imagewise exposed and the imagewise nonexposed portions are transferred to the receiver base.

One then provides a transparent cover sheet having an adhesion promoted surface. Such transparent cover sheets may comprise any material listed above as being suitable for the transparent support. However, instead of having a release surface, the transparent cover sheet is provided with an adhesion promoted surface. Adhesion promoted surfaces are well known in the art. The preferred films are surface modified to provide an adhesion promoted function. Such modifications of the transparent support are preferred to later increase the adhesion of the nonexposed areas of the photosensitive coating to the cover sheet. Therefore, as defined within the context of this invention, an adhesion promoted surface is one wherein the surface has been modified to make it more receptive to the imagewise nonexposed areas of the photosensitive coating. Such surface modifications include using a flame, electrical discharge, corona discharge, chemical etch, and surface coatings. The surface coatings for adhesion promotion modify the surface without contributing any mechanical or optical film properties of their own. They are commonly incorporated during the manufacturing process of the support. They may be monomolecular thick but are generally several layers thick. The dried surface coatings are extremely thin, preferably between about 0.001 um and about 0.1 um, and therefore not self supporting. They are strongly bonded to the transparent cover such that these surface coatings completely remain with the support during peel development. In other words, they are not partially nor wholly removed from the support during peel development. Examples of surface modifying coatings are disclosed in U.S. Pat. Nos. 3,751,280; 3,819,773; 4,066,820; 4,098,952; 4,391,767; 4,486,483; 4,493,872; and 4,515,863. The preferred surface coating is a crosslinked polymer or copolymer of acrylic acid or methacrylic acid or their esters with a thickness of about 0.003 um.

The adhesion promoter is by definition not an adhesive. An adhesive is defined for the purpose of this invention to be a material which flows and wets both surfaces of the elements to which it adheres and fills in the gaps of their surfaces under suitable conditions of temperature and pressure. An adhesion promoter may act in this manner when it is applied to one surface but does not flow to the other surface. Coatings which are thicker than 0.1 um are not suitable for this application because thick coatings change the mechanical properties of the support and interfere with the optical clarity of the support. They may also absorb monomers from the photosensitive layer, cohesively fail during peel development, and release from the cover during peel development.

The transparent cover sheet is then laminated to the photosensitive composition layer with the adhesion promoted surface between the transparent cover sheet and said photosensitive composition layer. The photosensitive composition layer is then overall flood exposed through the transparent cover sheet to actinic radiation. The actinic radiation overall exposure is conducted in essentially the same manner as the first imagewise exposure, except there is no imagewise differentiation. That is the exposure is done without a photomask, or if lasers are used for exposure, there are no image and nonimage on/off signals and the entire photosensitive layer is exposed.

The photosensitive layer is then dry developed by stripping the transparent support from the receiver base at room temperature with a steady, continuous motion. No devices are necessary to hold down the receiver base during stripping because only moderate manual peeling forces are needed to separate the materials. The preferred peel angle relative to the peel direction is greater than 90°. The delamination leaves the imagewise photoexposed areas from the first exposure step on the adhesive layer of the receiver base and the nonexposed areas on the adhesion promoted surface of the transparent cover sheet. Thus, a negative image with the adhesive remains on the receiver base.

In the preferred embodiment, another photosensitive element produced according to step (A) above is laminated via another adhesive to the first negative image on the receiver base. The second photosensitive layer preferably has a different color than the first. After lamination to the receiver base and exposure, the support and release surface of the second photosensitive layer is removed as was done with the first support. A second transparent cover sheet having an adhesion promoted surface is laminated as before with heat and pressure, to the second photosensitive composition layer with the adhesion promoted surface between the transparent cover sheet and the second photosensitive composition layer. After overall exposing the photosensitive composition through the second transparent cover sheet to actinic radiation and peeling apart as before, the imagewise exposed portions of the colored, photosensitive composition from step (B) are transferred to the receiver base on top of the two adhesive layers and the first image. The imagewise nonexposed portions of the colored, photosensitive composition from step (B) appear on the adhesion promoted surface of the second transparent cover sheet.

This process may be repeated as desired until a full multicolored image appears on the same receiver base. Therefore, a third and a fourth image may be added in a manner similar to that used to produce the second image. In the usual case, four colored layers are employed to produce a full color reproduction of a desired image. These four colors are cyan, magenta, yellow, and black.

A matte finish of the final image may be obtained by embossing the shiny, top surface of the image with a matte material, such as Melinex 377 from ICI. This is done by laminating together the final image and matte material. The matte material is then generally removed after lamination. The advantage of this method is that the finish of the final proof can be determined by careful selection of the matting material.

The final four color proof may be given a subsequent uniform, blanket exposure to photoharden the exposed, colored areas on the receiver base. A protective layer may also be laminated on top of the last dry developed layer.

The following nonlimiting examples serve to illustrate the invention.

EXAMPLE 1

A photosensitive solution is prepared by mixing the following ingredients in parts by weight:

| | |
|---|---|
| Tetrahydrofuran | 18.62 |
| Dowanol PM (1-methoxy-2-propanol) | 37.16 |
| Diacetone alcohol | 13.94 |
| Dipentaerythritolpentaacrylate (Sartomer 399) | 2.58 |
| 2-Biphenyl-4,6-bis-trichloromethyl-s-triazine | 0.71 |
| Polyvinyl formal (Formvar 12/85, Monsanto) | 0.90 |
| Magenta pigment dispersion (5% Permanent Carmine SBB, 6% Formvar 12/85, 44.5% gamma butyrolactone, 44.5% 1-methoxy-2-propanol) | 26.09 |

The solution is coated on a 3-mil silicone treated transparent polyester sheet available from Custom Coating and Lamination Corporation, using a #12 Meier rod, and dried. It is then overcoated with a solution of a thermoplastic adhesive of the following composition using a #24 Meier rod, and dried:

| | |
|---|---|
| Polyvinylacetate/crotonic acid ammonia salt (Mowilith CT-5, Hoechst AG) | 16% |
| Water | 76% |
| Ethanol | 8% |

This element is laminated to a receiver base sheet of Pressmatch Commercial Base (available from Hoechst Celanese Corporation), using heat and pressure. This composite is imagewise exposed to actinic radiation from a Berkey-Ascor exposure frame with a 2 kW Addalux lamp for 45 seconds through the silicone treated transparent polyester support, after which the silicone treated transparent support is stripped away. To the thusly exposed photosensitive color layer containing a polymerized, latent image, there is then laminated a 3-mil developing sheet of adhesion promoted polyester (Melinex 505, ICI). This construction is then flood exposed to actinic radiation for 30 seconds, and the polyester sheet is peeled away, removing the areas complementary to the latent image resulting from the first, imagewise exposure. A good quality, negative image is left attached to the receiver base via the adhesive layer. Repeating this procedure for photosensitive composition layers containing black, yellow and cyan elements, and laminating the photosensitive sheets sequentially as above to the same receiver base yields a full color negative color proof.

EXAMPLE 2

Example 1 is repeated except a 2 mil polyethylene sheet is used as the transparent support in place of the silicone treated polyester. A good quality image is attained.

EXAMPLE 3

Example 1 is repeated except the transparent support is prepared as follows. A solution of 1% Vinex 4004 polyvinyl alcohol copolymer (Air Products) in water is coated on a 3 mil sheet of Melinex 505 with a #12 Meier rod and dried, thus creating a release surface on the transparent support. The photosensitive solution from Example 1 is coated on this surface and dried and the procedure from Example 1 is repeated. After imagewise exposure, the transparent support is stripped away carrying away with it the Vinex 4004 release layer. The procedure from Example 1 yields a good quality negative image on the adhesive layer on the receiver base.

EXAMPLE 4

Example 1 is repeated except a 2 mil corona treated polyester sheet is used as the transparent cover sheet in the flood exposure step. The procedure yields a good quality negative image on the adhesive layer of the receiver base.

EXAMPLE 5

Example 3 is repeated except an untreated sheet of 3-mil polyester (Melinex 516) is used as the developing sheet in the flood exposure step. The flood exposure time is 90 seconds and the procedure yields a fair quality negative image.

What is claimed is:

1. A method for forming a colored image which comprises, in order:
    (A) providing a photosensitive element which comprises, in order:
        (i) a transparent support having a release surface; and
        (ii) a photosensitive composition layer on said release surface, which photosensitive layer comprises an organic binding resin, a colorant, a photoinitiator, and a free radical polymerizable acrylate or methacrylate component having at least two ethylenically unsaturated groups, wherein said binding resin is present in sufficient amount to bind the composition components into a uniform film, and wherein said colorant is present in sufficient amount to uniformly color the composition, and wherein said photoinitiator is present in sufficient amount to initiate the free radical polymerization of said polymerizable component upon exposure to sufficient actinic radiation, and wherein said polymerizable component is present in sufficient amount to provide image differentiation when the composition is imagewise exposed to actinic radiation; and
        (iii) an thermoplastic adhesive layer adhered to said colored, photosensitive layer, which adhesive layer comprises a thermoplastic resin which has a $T_g$ in the range of from about 25° C. to about 100° C.; and
    (B) providing a receiver base to which said adhesive layer is laminated at elevated temperature and pressure; and then imagewise exposing said photosensitive composition through the transparent support to actinic radiation; and
    (C) stripping away said transparent support and said release layer from said photosensitive composition layer thereby transferring the adhesive layer and the entire colored, photosensitive composition layer to the receiver base; and
    (D) providing a transparent cover sheet having an adhesion promoted surface, and laminating said transparent cover sheet with heat and pressure, to said photosensitive composition layer with the adhesion promoted surface between the transparent cover sheet and said photosensitive composition layer; and
    (E) overall exposing said photosensitive composition through the transparent cover sheet to actinic radiation; and
    (F) peeling apart said transparent cover sheet with its adhesion promoted surface and said receiver base, thereby transferring the imagewise exposed portions of the colored, photosensitive composition from step (B) to the receiver base while the imagewise nonexposed portions of the colored, photosensitive composition from step (B) are transferred to the adhesion promoted surface of the transparent cover sheet.

2. The method of claim 1 further comprising repeating steps (A) through (F) at least once wherein another photosensitive element according to step (A) having at least one colorant different from said colorant in step (A) (ii) is transferred to the adhesive layer and image portions of the prreviously processed photosensitive element on said receiver base, thereby forming a multicolored image on said receiver base.

3. The method of claim 2 further comprising providing a protective coating on said multicolore image.

4. The method of claim 2 further comprising providing a matte surface on said multicolored image.

5. The method of claim 2 further comprising conducting another overall exposure to harden said multicolored image.

6. The method of claim 1 wherein said transparent support in step (A)(i) comprises polyethylene terephthalate.

7. The method of claim 1 wherein said release surface in step (A)(i) comprises a silicone or polyvinyl alcohol containing composition.

8. The method of claim 1 wherein said photosensitive composition in step (A)(ii) comprises one or more monomers selected fromthe group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, besphenol A ethoxylate dimethacrylate, trimethylolpropane ethoxylate triacrylate, and trimethylolpropane propoxylate triacrylate.

9. The method of claim 1 wherein said photosensitive composition in step (A)(ii) comprises one or more photoinitiators selected from the group consisting of 2,3-di(4-methoxyphenyl)quinoxaline, 9-phenylacridine, bis(2,4,5-triphenyl)imidazole and 2-biphenyl-4,6-bis-trichloromethyl-s-triazine.

10. The method of claim 1 wherein said photosensitive composition in step (A)(ii) comprises one or more colorants selected from the group consisting of dyes and pigments.

11. The method of claim 1 wherein said photosensitive composition in step (A)(ii) comprises one or more binding resins selected from the group consisting of styrene/maleic anhydride copolymers and their half esters; acrylic polymers and copolymers; polyamides; polyvinyl pyrrolidones; cellulosic resins; phenolic resins; and polyvinyl acetals.

12. The method of claim 11 wherein said polyvinyl acetal is a vinyl formal polymer or copolymer containing vinyl formal.

13. The method of claim 1 wherein said photosensitive composition in step (A)(ii) further comprises one or more ingredients selected from the group consisting of spectral sensitizers, thermal polymerization inhibitors, plasticizers, oligomers, surfactants, inert fillers, antihalation agents, hydrogen atom donors, photoactivators, and optical brightening agents.

14. The method of claim 1 wherein said photosensitive composition layer has a coating weight that ranges from about 0.1 $g/m^2$ to about 5 $g/m^2$.

15. The method of claim 1 wherein the acrylate or methacrylate component is present in said photosensitive composition layer in an amount ranging from about 10% to about 60% by weight of the solids in the photosensitive composition.

16. The method of claim 1 wherein the photoinitiator component is present in said photosensitive composition layer in an amount ranging from about 2% to about 30% by weight of the solids in the photosensitive composition.

17. The method of claim 1 wherein the colorant component is present in said photosensitive composition layer in an amount ranging from about 10% to about 50% by weight of the solids in the photosensitive composition.

18. The method of claim 1 wherein the binding resin is present in said photosensitive composition layer in an amount ranging from about 10% to about 75% by weight of the solids in the photosensitive composition.

19. The method of claim 1 wherein said adhesive layer in step (A)(iii) comprises one or more thermoplastic polymers having a softening temperature in the range of about 40° C. to about 200° C.

20. The method of claim 1 wherein said adhesive layer in step (A)(iii) comprises a vinyl acetate polymer or copolymer containing vinyl acetate.

21. The method of claim 20 wherein polyvinyl acetate is present in the said adhesive layer in an amount of at least about 50% by weight of said adhesive layer.

22. The method of claim 1 wherein said adhesive layer further comprises a plasticizer.

23. The method of claim 22 wherein said plasticizer is polymeric.

24. The method of claim 1 wherein said adhesive layer further comprises one or more ingredients selected from the group consisting of UV absorbers, antistatic compositions, optical brighteners, and plasticizers.

25. The method of claim 1 wherein said adhesive layer has a coating weight that ranges from abut 2 g/m$^2$ to about 30 g/m$^2$.

26. The method of claim 1 wherein a plasticizer is present in the said adhesive layer in an amount of up to about 30% by weight of said adhesive layer.

27. The method of claim 1 wherein the said receiver base comprises paper, coated paper, or a polymeric film.

28. The method of claim 1 wherein each of said laminations are conducted at a temperature of from about 60° C. to about 120° C.

29. The method of claim 1 wherein said transparent cover sheet in step (D) comprises polyethylene terephthalate.

30. The method of claim 1 wherein said adhesion promoted surface in step (D) comprises a surface coating of a crosslinked polymer or copolymer of acrylic acid or methacrylic acid or their esters.

31. The method of claim 30 wherein said adhesion promoted surface coating has a thickness of from about 0.001 and about 0.1 um.

* * * * *